(12) United States Patent
Kim et al.

(10) Patent No.: US 9,226,430 B2
(45) Date of Patent: Dec. 29, 2015

(54) POWER SEMICONDUCTOR MODULE

(71) Applicant: SAMSUNG ELECTRO-MECHANICS CO., LTD., Suwon (KR)

(72) Inventors: Kwang Soo Kim, Suwon (KR); Tae Hyun Kim, Suwon (KR); Bum Seok Suh, Suwon (KR); In Wha Jeong, Suwon (KR); Young Ki Lee, Suwon (KR)

(73) Assignee: SAMSUNG ELECTRO-MECHANICS CO., LTD., Suwon (KR)

(*) Notice: Subject to any disclaimer, the term of this patent is extended or adjusted under 35 U.S.C. 154(b) by 313 days.

(21) Appl. No.: 13/789,030

(22) Filed: Mar. 7, 2013

(65) Prior Publication Data

US 2014/0185242 A1 Jul. 3, 2014

(30) Foreign Application Priority Data

Dec. 27, 2012 (KR) .......................... 10-2012-0155293

(51) Int. Cl.
*H05K 7/20* (2006.01)
*H01L 23/367* (2006.01)
*H01L 23/498* (2006.01)
*H01L 25/07* (2006.01)

(52) U.S. Cl.
CPC .............. *H05K 7/209* (2013.01); *H01L 23/367* (2013.01); *H01L 23/49833* (2013.01); *H01L 23/49861* (2013.01); *H01L 25/072* (2013.01); *H01L 2224/32245* (2013.01); *H01L 2224/48229* (2013.01); *H01L 2224/49175* (2013.01); *H01L 2224/73265* (2013.01); *H01L 2924/1305* (2013.01); *H01L 2924/13055* (2013.01); *H01L 2924/13091* (2013.01); *H01L 2924/15159* (2013.01)

(58) Field of Classification Search
None
See application file for complete search history.

(56) References Cited

U.S. PATENT DOCUMENTS

| 5,349,201 | A | * | 9/1994 | Stanchina et al. ............... 257/18 |
| 6,166,937 | A | * | 12/2000 | Yamamura et al. ............ 363/141 |
| 6,201,696 | B1 | * | 3/2001 | Shimizu et al. ................ 361/704 |
| 6,903,387 | B2 | * | 6/2005 | Hase ............................. 257/197 |
| 7,928,587 | B2 | * | 4/2011 | Tamba et al. .................. 257/784 |
| 8,587,105 | B2 | * | 11/2013 | Nakao et al. ................... 257/678 |
| 2003/0189246 | A1 | * | 10/2003 | Iwaki et al. .................... 257/706 |
| 2007/0076422 | A1 | * | 4/2007 | Nicolai .......................... 362/547 |

(Continued)

FOREIGN PATENT DOCUMENTS

| JP | 2002-43510 | 2/2002 |
| KR | 1998-043254 | 9/1998 |

(Continued)

OTHER PUBLICATIONS

Korean Office Action issued Jul. 1, 2014 in corresponding Korean Patent Application No. 10-2012-0155293.

*Primary Examiner* — Courtney Smith

(57) ABSTRACT

There is provided a power semiconductor module in which power semiconductor elements, integration of which may be difficult due to heating, are modularized. The power semiconductor module includes: a heat dissipation substrate electrically connected to a common connection terminal; and a plurality of electronic elements disposed on the heat dissipation substrate, wherein the electronic elements have varying spaces therebetween.

13 Claims, 5 Drawing Sheets

(56) References Cited

U.S. PATENT DOCUMENTS

2009/0207639 A1 8/2009 Tanaka et al.
2011/0069458 A1* 3/2011 Nakao et al. .................. 361/728

FOREIGN PATENT DOCUMENTS

KR 10-2007-0064658 6/2007
KR 10-2011-0090300 8/2011

* cited by examiner

POWER SEMICONDUCTOR MODULE

CROSS-REFERENCE TO RELATED APPLICATIONS

This application claims the priority of Korean Patent Application No. 10-2012-0155293 filed on Dec. 27, 2012, in the Korean Intellectual Property Office, the disclosure of which is incorporated herein by reference.

BACKGROUND OF THE INVENTION

1. Field of the Invention

The present invention relates to a power semiconductor module and, more particularly, to a power semiconductor module in which power semiconductor elements, integration of which may be difficult due to heating, are modularized.

2. Description of the Related Art

Recently, market demand for portable electromagnetic products has sharply increased, and in order to meet this demand, electronic components mounted in systems thereof are required to be smaller and more lightweight.

Thus, besides methods for reducing sizes of electronic elements, a method of installing as many elements and conductive wires as possible within a predetermined space is an important issue in designing a semiconductor package.

Meanwhile, in the case of a power semiconductor element, a large amount of heat is generated when it is driven. High heat may affect a lifespan and operational stability of an electronic product, so thus, heat dissipation of the package is also a critical issue.

To this end, a related art power semiconductor module has a structure in which power elements and control elements are commonly mounted on one surface of a circuit board and a heat dissipation plate for dissipating heat is disposed on the other surface thereof.

However, the related art power semiconductor package has the following problems.

First, according to the tendency for compact packages, a number of semiconductor elements disposed in the equal space may be relatively increased, generating a large amount of heat, and in this case, since a heat dissipation plate is only disposed below the package, a failure of effective heat dissipation results.

In addition, in order to configure a high capacity power semiconductor module, several power semiconductor elements are connected in parallel so as to be used. However, parallel-connected elements, in spite of having an advantage in accommodating a high capacity current, are disadvantageous in that, due to an imbalance in heating of the respective power semiconductor elements, and the like, the elements are extremely limitedly disposed and only an extremely limited number of elements may be connected in parallel so as to be used.

Also, since the respective elements have different levels of electrical resistance according to dispositions thereof, different amounts of heat may be generated thereby, and such a heating imbalance may result in a degradation of reliability and defective operating of a particular element.

RELATED ART DOCUMENT (Patent document 1) Korean Patent Laid Open Publication No. 1998-0043254

SUMMARY OF THE INVENTION

An aspect of the present invention provides a power semiconductor module having excellent heat dissipation characteristics.

Another aspect of the present invention provides a power semiconductor module in which semiconductor elements are asymmetrically disposed.

According to an aspect of the present invention, there is provided a power semiconductor module including: a heat dissipation substrate electrically connected to a common connection terminal; and a plurality of electronic elements disposed on the heat dissipation substrate, wherein the electronic elements have varying spaces therebetween.

The electronic elements may be disposed such that spaces therebetween are increased in width in a direction closer to the common connection terminal.

The power semiconductor module may further include: a base substrate; at least one circuit board disposed on the base substrate; and a plurality of external connection terminals attached to the circuit board, wherein the heat dissipation substrate is disposed on the circuit board and the electronic elements are electrically connected to the common connection terminal through the heat dissipation substrate and the circuit board.

The circuit board may include a first circuit board to which a gate terminal is attached, a second circuit board to which an emitter terminal is attached, and a third circuit board to which the common connection terminal is attached.

The electronic elements may be electrically connected to the first and third circuit boards through bonding wires.

The power semiconductor module may further include: a support substrate disposed below the base substrate and dissipating heat transmitted from the base substrate outwardly.

The common connection terminal may be a collector terminal, and the external connection terminal may include a gate terminal and an emitter terminal.

The electronic elements may be classified as first, second, third, and fourth electronic elements according to an order in which the electronic elements are disposed to be adjacent to the common connection terminal, and intervals $X_1$, $X_2$, and $X_3$ between the electronic elements may satisfy Equation 1 shown below:

$$0.8d > X_1 + X_2 + X_3 > 0.4d \qquad \text{[Equation 1]}$$

Here, d is an overall length of the heat dissipation substrate 50, $X_1$ is a space between the first electronic element and the second electronic element, $X_2$ is a space between the second electronic element and the third electronic element, and $X_3$ is a space between the third electronic element and the fourth electronic element.

$X_1$, $X_2$, and $X_3$ may satisfy Equation 2 shown below:

$$X_1 > X_2 > X_3 \qquad \text{[Equation 2]}$$

$X_3$ and $X_2$ may satisfy Equation 3 and Equation 4 shown below.

$$X_3 = (1.5 \sim 3)X_2 = (1.5 \sim 15)X_1 \qquad \text{[Equation 3]}$$

$$X_2 = (1.0 \sim 5)X_1 \qquad \text{[Equation 4]}$$

The heat dissipation substrate may have different thicknesses according to positions of the electronic elements.

The heat dissipation substrate may have reduced thicknesses in a direction away from the common connection terminal.

The heat dissipation substrate may have steps formed according to positions of the electronic elements.

The electronic elements may be classified as first, second, third, and fourth electronic elements according to an order in which the electronic elements are disposed to be adjacent to the common connection terminal, and intervals $X'_1$, $X'_2$, and $X'_3$ between the electronic elements may satisfy Equation 5 through Equation 7 shown below:

$$H_4 = (X'_4/X'_3)H_3 \quad \text{[Equation 5]}$$

$$H_3 = (X'_3/X'_2)H_2 \quad \text{[Equation 6]}$$

$$H_2 = (X'_2/X'_1)H_1 \quad \text{[Equation 7]}$$

Here, $H_4$ is a height of the heat dissipation substrate at which the first electronic element is disposed, $H_3$ is a height of the heat dissipation substrate at which the second electronic element is disposed, $H_2$ is a height of the heat dissipation substrate at which the third electronic element is disposed, $H_1$ is a height of the heat dissipation substrate at which the fourth electronic element is disposed, $X'_4$ is a distance of the mounting surface of the heat dissipation substrate at which the first electronic device is disposed, $X'_3$ is a distance of the mounting surface of the heat dissipation substrate at which the second electronic device is disposed, $X'_2$ is a distance of a mounting surface of the heat dissipation substrate at which the third electronic element is disposed, and $X'_1$ is a distance of a mounting surface of the heat dissipation substrate at which the fourth electronic element is disposed.

According to another aspect of the present invention, there is provided a power semiconductor module including: a common connection terminal; and a plurality of electronic elements disposed in a row from the common connection terminal and electrically connected to the common connection terminal, wherein the electronic elements are disposed such that spaces therebetween are reduced in a direction away from the common connection terminal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
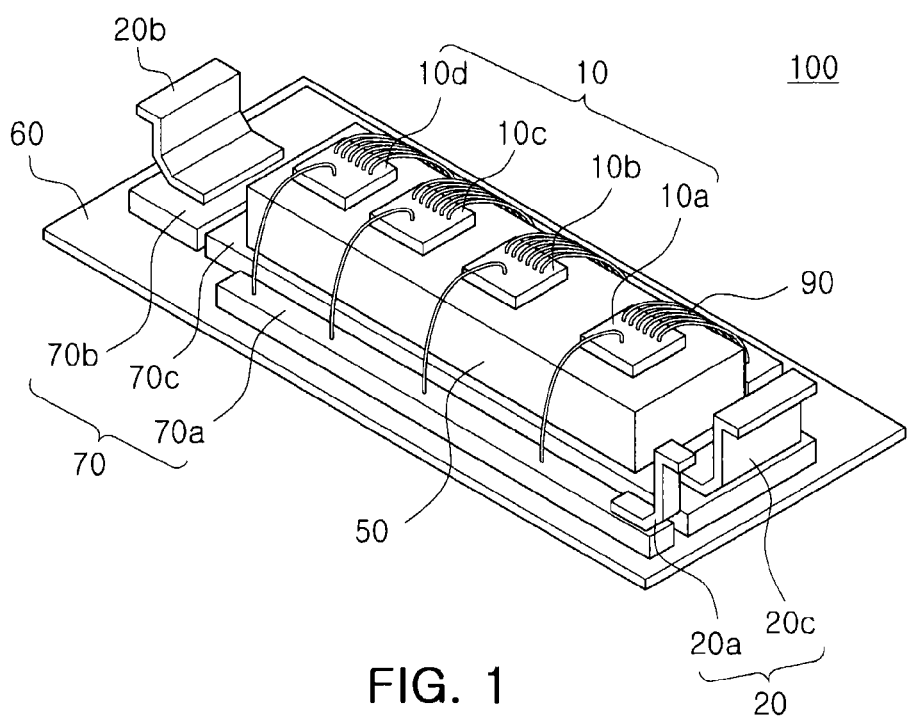
FIG. 1 is a perspective view schematically illustrating a power semiconductor module according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 2:
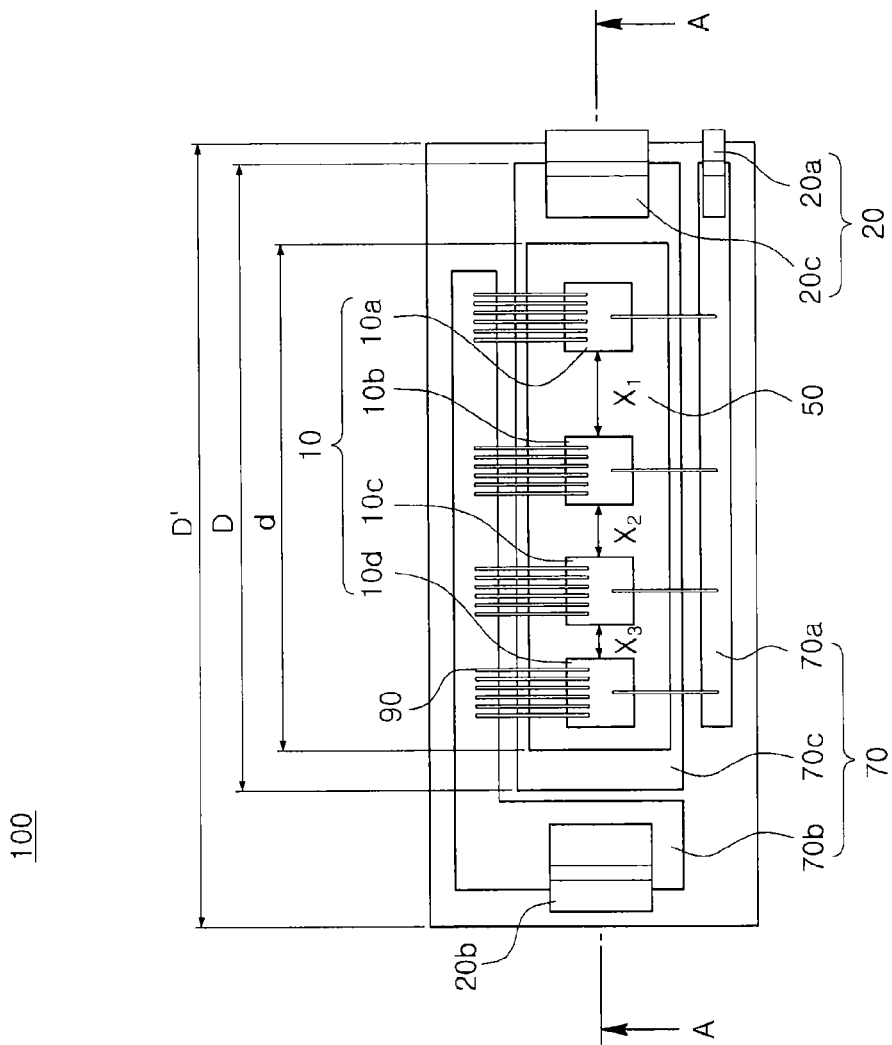
FIG. 2 is a plan view of the power semiconductor module of FIG. 1.
Figure 3:
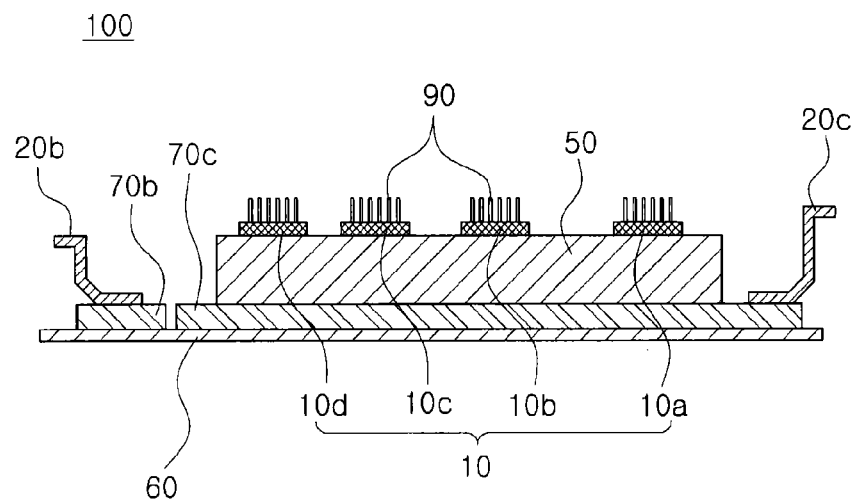
FIG. 3 is a cross-sectional view taken along line A-A of FIG. 2.

FIG. 1 is a perspective view schematically illustrating a power semiconductor module according to an embodiment of the present invention. FIG. 2 is a plan view of the power semiconductor module of FIG. 1. FIG. 3 is a cross-sectional view taken along line A-A of FIG. 2.

Referring to FIGS. 1 through 3, a power semiconductor module 100 according to the present embodiment may include an electronic element 10, an external connection terminal 20, a circuit board 70, a base substrate 60, and a heat dissipation substrate 50.

The electronic element 10 may include various elements such as a passive element, an active element, and the like. In particular, the electronic element 10 according to an embodiment of the present invention may include a power MOSFET, a bipolar junction transistor (BJT), an insulated-gate bipolar transistor (IGBT), a diode, or a combination thereof. Namely, in the present embodiment, the electronic element 10 may be a power semiconductor package including all or some of the foregoing elements. However, the present invention is not limited thereto.

Also, the electronic element 10 according to the present embodiment may include a plurality of electrodes formed therein. In detail, the electronic element 10 may include a gate electrode and an emitter electrode formed on one surface thereof and a collector electrode formed on the other surface thereof.

A plurality of electronic elements 10 may be disposed in a row on a heat dissipation substrate.

A plurality of external connection terminals 20 are provided, all of which may be formed by bending metal plates. Thus, the external connection terminals 20 according to the present embodiment may be electrically connected to the respective electronic elements 10 through the circuit boards 70.

The external connection terminals 20 according to the present embodiment may include first and second connection terminals 20a and 20b as individual connection terminals, and a common connection terminal 20c. Here, the first connection terminal 20a may be a gate connection terminal 20a connected to the gate electrode of the electronic element 10, the second connection terminal 20b may be an emitter connection terminal 20b connected to the emitter electrode of the electronic element 10.

Also, the common c connection terminal 20c may be a collector connection terminal 20c connected to the collector electrode of the electronic element 10.

The external connection terminals 20 may be electrically connected to the respective electrodes of the electronic elements 10 through the circuit boards 70. In detail, the first connection terminal 20a may be electrically connected to the gate electrode of the electronic element 10 through the first circuit board 70a and a bonding wire 90.

Also, the second connection terminal 20b may be connected to the emitter electrode of the electronic element 10 through the second circuit board 70b and the bonding wire 90.

The common connection terminal 20c may be connected to the collector electrode of the electronic element 10 through the third circuit board 70c and the heat dissipation substrate.

Here, the circuit boards 70 as general insulating boards may be, for example, printed circuit boards (PCBs), ceramic substrates, pre-molded substrates, direct bonded copper substrates, or insulated metal substrates (IMSs)

Wiring patterns (not shown) may be formed on the respective circuit boards 70. The bonding wires 90 and the external connection terminals 20 may be attached to the wiring patterns so as to be electrically connected to one another.

The bonding wires 90 may be made of metal, and in this case, for example, aluminum (Al), gold (Au), or alloys thereof may be used. Also, in order to join the bonding wires 90 to the electronic elements 10 and the wiring patterns of the circuit boards 70, the electronic elements 10 and the wiring patterns may have a connection portion such as a general connection pad, or the like, respectively.

The base substrate 60 is a substrate supporting the power semiconductor module 100 according to the present embodiment overall. Thus, the power semiconductor module 100 according to the present embodiment may be formed by laminating the circuit boards 70, the heat dissipation substrate 50, and the like, on the base substrate 60.

The base substrate 60 may be formed as a general insulating substrate. For example, the base substrate 60 may be a printed circuit board (PCB), a ceramic substrate, a pre-molded substrate, a directed bonded copper (DBC) substrate, or an insulated metal substrate (IMS).

The heat dissipation substrate 50 may be disposed on the third circuit board 70c to which the common connection terminal 20c is attached. In order to effectively dissipate heat outwardly, the heat dissipation substrate 50 may be made of a metal. Here, as a material for forming the heat dissipation substrate 50, aluminum (Al) or an aluminum alloy which is readily available at relatively low cost and has excellent heat conduction characteristics. However, the present invention is not limited thereto and any other metals having excellent heat conduction characteristics may also be used.

Also, a plurality of electronic elements 10 are disposed on the heat dissipation substrate 50. The electronic elements 10 may be disposed to be spaced apart on an upper surface of the heat dissipation substrate 50, and may be electrically connected to the third circuit board 70c by the medium of the heat dissipation substrate 50.

In particular, in the power semiconductor module 100 according to an embodiment of the present invention, the electronic elements 10 are disposed to be spaced apart at varying intervals on the heat dissipation substrate 50.

In detail, the electronic elements 10 of the power semiconductor module 100 are disposed such that spaces therebetween are increased in width in a direction closer to the common connection terminal 20c and the spaces therebetween are decreased in width in a direction away from the common connection terminal 20c.

This configuration is provided to effectively dissipate heat generated by the respective electronic elements 10, and it will be described as follows.

As illustrated in FIG. 3, when a plurality of electronic elements 10 are disposed in a row in the single power semiconductor module 100, paths between the respective electronic elements 10 and the common connection terminal 20c are shared by all the electronic elements 10.

Also, due to such a structure, the path between the common connection terminal 20c and the electronic element 10a (i.e., the first electronic element) disposed to be closest to the common connection terminal may be used as a common path used by all the other electronic elements 10 together. Thus, a relatively large current may flow in the path between the common connection terminal 20c and the electronic element 10a, relative to the paths of the other electronic elements 10, and thus, a greater amount of heat than those of the other electronic elements may be generated in the path.

When heat generation is increased, resistance of the corresponding path is increased, and such an increase in the resistance acts as a factor increasing heat generation, bringing about a negative feedback effect in which temperature continues to rise.

In addition, since heat generated by the electronic elements 10 is continuously increased, heat having a relatively high temperature is continuously supplied to the common path between the common connection terminal 20c and the first electronic element 10a.

As mentioned, the generation of heat having a high temperature in the common path may increase resistance of the common path to degrade performance and reliability of even the other electronic elements distant from the common connection terminal 20c, as well as that of the first electronic element 10a.

Also, as resistance and heat generation are increased, a junction temperature in the vicinity of the first electronic element 10a is high relative to the other portions on the heat dissipation substrate 50. Thus, it is difficult to effectively dissipate heat. Namely, since heat is concentrated in a particular portion, rather than being dissipated through the entirety of the heat dissipation substrate 50, a heat dissipation effect is degraded.

In addition, in terms of the overall power semiconductor module 100, when an overall temperature of the power semiconductor module 100 is increased, resistance of the overall module is increased, accelerating the foregoing phenomenon.

Thus, in order to solve the problem, the power semiconductor module 100 according to the present embodiment is configured such that spaces between the electronic elements 10 are increased in width in a direction closer to the common connection terminal 20c.

Namely, in order to evenly distribute heat generated from between the electronic element 10 and the common connection terminal 20c, namely, between the third circuit board 70c and the heat dissipation substrate 50, at the maximum level, the electronic elements 10 disposed to be close to the common connection terminal 20c are configured to secure a maximum peripheral space. Namely, the distances between the electronic elements 10 are narrowed as the electronic elements 10 are disposed to be distant from the common connection terminal 20c.

Through such a configuration, a heat dissipation effect of the power semiconductor module 100 having the same elements and the same size can be maximized.

Meanwhile, the heat dissipation effect may be better as the spaces between the electronic elements 10 are increased, but in this case, the size of the power semiconductor module 100 may be increased. Thus, the present invention proposes a structure whereby the size of the power semiconductor module 100 is minimized and a maximum heat dissipation effect is obtained.

Figure 4:
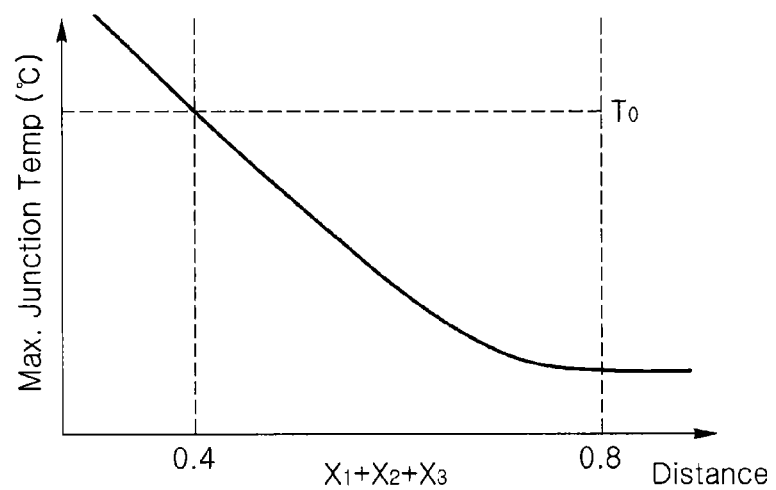
FIG. 4 is a graph showing temperatures measured according to a change in spaces between electronic elements in the power semiconductor module of FIG. 1.

FIG. 4 is a graph showing temperatures measured according to a change in distances between electronic elements in the power semiconductor module of FIG. 1.

Referring to FIGS. 1 and 4, it can be seen that it is appropriate for the overall space ($X_1+X_2+X_3$) between the electronic elements 10 to be set within the range of 0.8 to 0.4 over the overall length of the heat dissipation substrate 50, as shown in Equation 1 below.

$$0.8d > X_1+X_2+X_3 > 0.4d \quad \text{[Equation 1]}$$

Here, d is the overall length of the heat dissipation substrate 50, $X_1$ is a space (or distance) between the first electronic element 10a and the second electronic element 10b, $X_2$ is a space between the second electronic element 10b and the third electronic element 10c, and $X_3$ is a space between the third electronic element 10c and the fourth electronic element 10d.

In a case in which the overall space ($X_1+X_2+X_3$) is smaller than 0.4 d, a critical temperature is exceeded although the spaces are adjusted, making it difficult to obtain a heat dissipation effect substantially. Also, in a case in which the overall space ($X_1+X_2+X_3$) is greater than 0.8 d, a remaining space is very narrow, making it difficult to dispose the electronic elements 10 substantially.

Thus, preferably, the overall space ($X_1+X_2+X_3$) is set to be greater than 0.4 d and smaller than 0.8 d.

Also, relationships of $X_1$, $X_2$, and $X_3$ follow Equation 2 to Equation 4 below.

$$X_1 > X_2 > X_3 \qquad [\text{Equation 2}]$$

$$X_3 = (1.5 \sim 3) X_2 = (1.5 \sim 15) X_1 \qquad [\text{Equation 3}]$$

$$X_2 = (1.0 \sim 5) X_1 \qquad [\text{Equation 4}]$$

Equation 3 and Equation 4 are numerical values obtained through iterative experiments, which were obtained based on a configuration in which a length D of the third circuit board 70c is 0.95 times a length D' of the base substrate 60 and a length d of the heat dissipation substrate 50 is 0.95 times a length D of the second circuit board 70.

Figure 5:
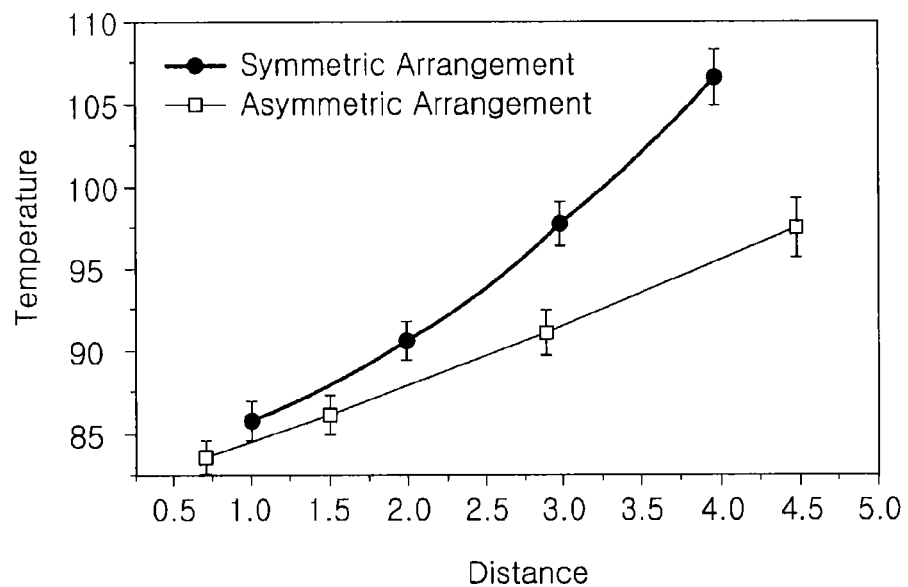
FIG. 5 is a graph showing measured temperatures of electronic elements according to an embodiment of the present invention.

FIG. 5 shows a graph obtained by measuring temperatures of the power semiconductor module 100 according to the present embodiment.

FIG. 5 is a graph showing measured temperatures of electronic elements according to an embodiment of the present invention, in which temperature distributions in symmetric arrangement and asymmetric arrangement of the electronic elements 10 are illustrated. Here, the distance is a distance from a portion in which the fourth electronic element 10d is mounted, i.e., an end of the opposite side of the common connection terminal 20c, among both ends of the heat dissipation substrate 50.

Referring to FIG. 5, when the electronic elements 10 were disposed at equal intervals, it was measured that the temperature of the first electronic element 10a was increased to approximately 106° C. However, when the electronic elements 10 were disposed at different intervals, it was measured that the first electronic element 10a was increased to approximately 97° C. Namely, it can be seen that when the electronic elements 10 have varying intervals as in the present embodiment, the temperature of the first electronic element 10a can be lowered by approximately 10% relative to the case in which the electronic elements are disposed at equal intervals.

Also, it can be seen that when the electronic elements were disposed at equal intervals, a temperature difference between the first electronic element 10a and the fourth electronic element 10d was measured to be approximately 20° C., but when the electronic elements 10 were disposed at different intervals, a temperature difference between the first electronic element 10a and the fourth electronic element 10d was measured to be approximately 15° C., indicating that heat was generated relatively evenly.

In addition, in the case of the disposition of the electronic elements at equal intervals, the junction temperature tended to be sharply increased, but in an embodiment of the present invention, the junction temperature was measured to be increased linearly relatively. Thus, advantageously, a lifespan limit and degree of reliability of the power semiconductor module 100 can be easily estimated.

According to the configuration, the first electronic element 10a disposed to be closest to the common connection terminal 20c may dissipate heat through a large area (or volume) of the heat dissipation substrate 50, relative to the other electronic elements 10. Thus, a maximum heat dissipation effect, while maintaining the size of the power semiconductor module 100, can be obtained.

The power semiconductor module according to an embodiment of the present invention is not limited to the foregoing embodiment and may be variously modified as necessary.

Figure 6:
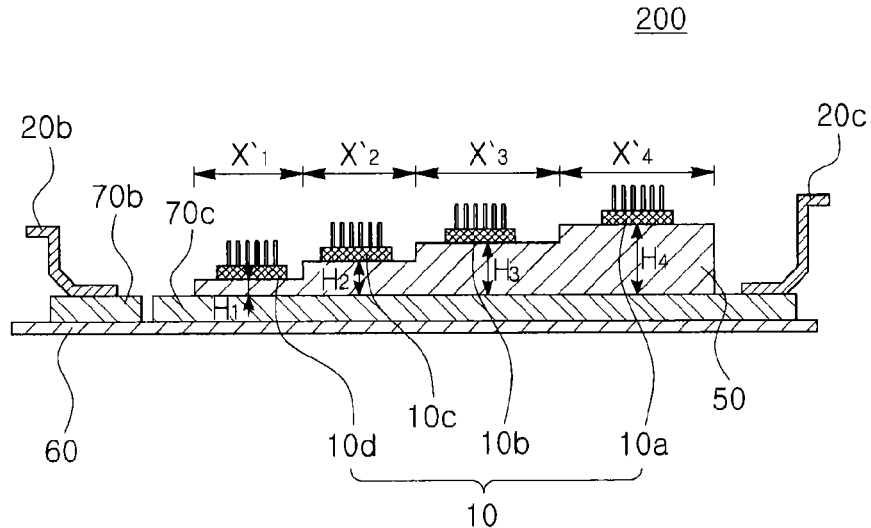
FIG. 6 is a cross-sectional view schematically illustrating a power semiconductor module according to another embodiment of the present invention.

FIG. 6 is a cross-sectional view schematically illustrating a power semiconductor module according to another embodiment of the present invention, taken along line A-A of FIG. 2.

A power semiconductor module 200 according to the present embodiment is configured to be similar to the power semiconductor module (100 of FIG. 1) as described above, and is different only in a structure of the heat dissipation substrate. Thus, a detailed description of the same configuration as that of the foregoing embodiment will be omitted, and the structure of the heat dissipation substrate will be largely described.

In the power semiconductor module 200 according to the present embodiment, the electronic elements 10 are formed at different intervals and disposed at different heights.

In detail, the first electronic element 10a generating the largest amount of heat is disposed in the highest position, and the fourth electronic element 10d generating the smallest amount of heat is disposed in the lowest position.

Here, the heights of the electronic elements 10 may be determined by thicknesses of the heat dissipation substrate 50. Namely, a portion of the heat dissipation substrate 50 in which the first electronic element 10a is disposed has the largest thickness, and a portion of the heat dissipation substrate 50 in which the fourth electronic element 10d is disposed has the smallest thickness.

To this end, the heat dissipation substrate 50 according to the present embodiment may have steps formed on an upper surface thereof.

Accordingly, the heat dissipation substrate 50 is formed to have a relatively large volume in a junction portion of the first electronic element 10a in which a relatively large amount of heat is generated, and the volume of the heat dissipation substrate 50 may be gradually reduced toward the fourth electronic element 10d.

Also, areas of mounting surfaces of the electronic elements 10 on the upper surfaces of the heat dissipation substrate 50 may be larger as the electronic elements 10 are closer to the common connection terminal 20c. Thus, due to the different areas of the mounting surfaces of the heat dissipation substrate 50 on which the electronic elements 10 are mounted, the electronic elements 10 may be disposed at different intervals therebetween.

Meanwhile, in the present embodiment, the heights (i.e., the heights of the heat dissipation substrate) at which the respective electronic elements 10 are disposed may be calculated based on horizontal distances (lengths) of the respective electronic elements. For example, the heights of the respective electronic elements 10 may be set through Equation 5 to Equation 7 shown below.

$$H_4 = (X'_4 / X'_3) H_3 \qquad [\text{Equation 5}]$$

Here, $H_4$ is a height of the heat dissipation substrate 50 at which the first electronic element 10 is disposed, $H_3$ is a height of the heat dissipation substrate 50 at which the second electronic element 10b is disposed, $X'_4$ is a distance of the mounting surface of the heat dissipation substrate 50 at which the first electronic device 10a is disposed, and $X'_3$ is a distance of the mounting surface of the heat dissipation substrate 50 at which the second electronic device 10b is disposed.

$$H_3 = (X'_3 / X'_2) H_2 \qquad [\text{Equation 6}]$$

Here, $H_2$ is a height of the heat dissipation substrate 50 at which the third electronic element 10c is disposed, and $X'_2$ is a distance of a mounting surface of the heat dissipation substrate 50 at which the third electronic element 10c is disposed.

$$H_2 = (X'_2/X'_1)H_1 \quad \text{[Equation 7]}$$

Here, $H_1$ is a height of the heat dissipation substrate 50 at which the fourth electronic element 10d is disposed, and $X'_1$ is a distance of a mounting surface of the heat dissipation substrate 50 at which the fourth electronic element 10d is disposed.

Equation 5 through Equation 7 are also numerical values obtained through iterative experiments, which were obtained based on a configuration in which a length D of the third circuit board 70c is 0.95 times a length D' of the base substrate 60 and a length d of the heat dissipation substrate 50 is 0.95 times a length D of the second circuit board 70.

Referring to Equation 5 through Equation 7, it can be seen that the heights of the respective electronic elements 10 were set to be proportional to the distances (or lengths) of the electronic elements 10.

In the case in which the power semiconductor module 200 is configured as described above, the respective electronic elements 10 are spaced apart from one another horizontally and vertically, so they can be more separated. Thus, a higher heat dissipation effect can be obtained.

In this manner, the power semiconductor module 200 according to an embodiment of the present invention may be configured to have various forms as long as the electronic elements can be disposed at different intervals.

Meanwhile, the present invention is not limited to the foregoing configuration, and may be variously applicable. For example, in the present embodiment, the intervals (or spaces) between the electronic elements 10 are set based on both the distances of the mounting surfaces of the electronic elements 10 and the heights of the heat dissipation substrate 50, but, leaving the horizontal distances of the electronic elements 10 set to be equal, the distances between the electronic elements 10 may be set only based on heights of the heat dissipation substrate 50.

The power semiconductor module 100 according to an embodiment of the present invention may be used alone, or a plurality of power semiconductor modules 100 may be combined to be used as a single integrated module.

Figure 7:
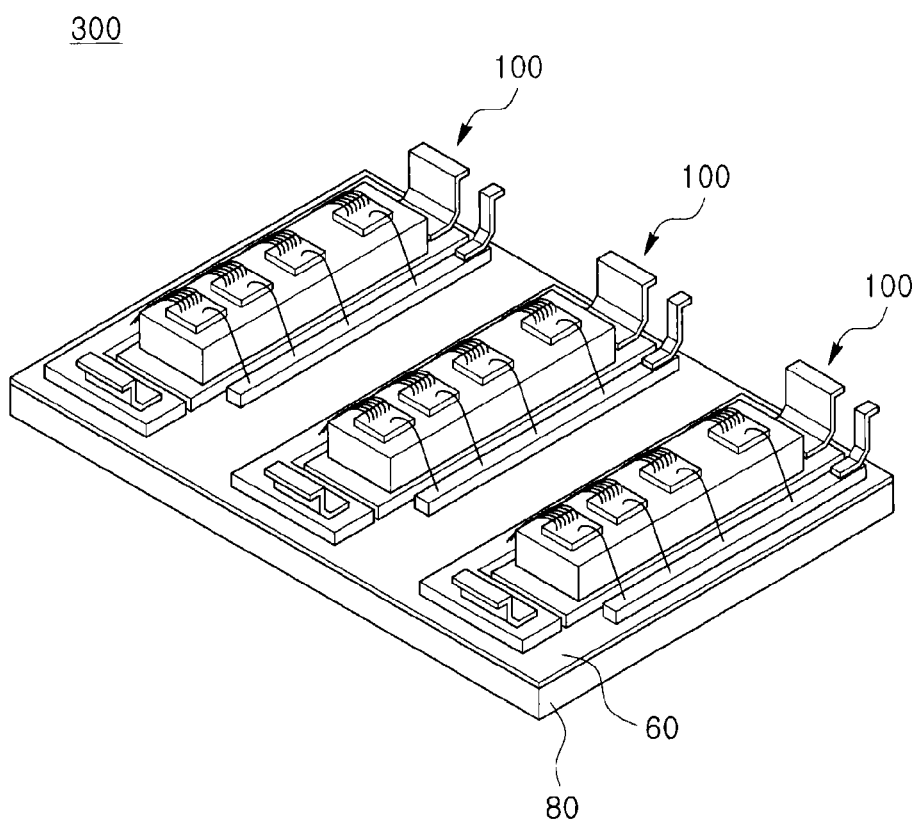
FIG. 7 is a perspective view schematically illustrating an integrated power semiconductor module according to an embodiment of the present invention.

FIG. 7 is a perspective view schematically illustrating an integrated power semiconductor module according to an embodiment of the present invention.

Referring to FIG. 7, an integrated module 300 according to the present embodiment may include a support substrate 80 on which a plurality of power semiconductor modules 100 are mounted.

The plurality of power semiconductor modules 100 may be disposed to be lined up. A base substrate 60 may be disposed on the support substrate 80.

The support substrate 80 may be in surface-contact with the base substrate 60 and outwardly dissipate heat transmitted from the base substrate 60. Thus, heat transmitted from the electronic elements 10 to the heat dissipation substrate 50 and the base substrate 60 may be transmitted to the support substrate 80 so as to be dissipated outwardly.

The support substrate 80 may be variously modified as long as it can readily dissipate heat outwardly.

For example, the support substrate 80 may be configured as a heat sink dissipating heat in the air. In this case, an outer surface of the support substrate 80 may have a plurality of protuberances (e.g., heat dissipation fins), depressions and protrusions, or the like, to increase a surface area in contact with air.

Also, the support substrate 80 may be a watercooling type cooling member in which a flow channel is formed and a refrigerant flowing in the flow channel absorbs heat. Alternatively, the support substrate 80 may be a heat dissipation system employing these schemes in a complex manner.

The integrated semiconductor package module according to the present embodiment is advantageous in that heat of power semiconductor modules can be effectively dissipated through the support substrate. Also, since a plurality of power semiconductor modules are integrated to be used as a single module, it can be easily manufactured and used. Also, capacity of the module can be easily increased.

As described above, in the power semiconductor module, the first electronic element disposed to be closest to the common connection terminal can dissipate heat through a large area (or volume) of the heat dissipation substrate relative to the other electronic elements. Thus, an optimal heat dissipation effect, while maintaining the size of the power semiconductor module, can be obtained.

In addition, since the junction temperature of the first electronic element is reduced, a generation of a problem in a particular electronic element due to imbalance in temperature distribution can be minimized, and thus, long-term reliability and performance of the module can be enhanced.

Meanwhile, the power semiconductor module according to the present invention is not limited to the foregoing embodiments and may be variously applicable. For example, in the foregoing embodiments, four electronic elements are disposed, but the present invention is not limited thereto. Namely, three electronic elements or five or more electronic elements may be disposed and may be variously applicable as necessary.

Also, in the foregoing embodiments, the power semiconductor module is described as an example, but the present invention is not limited thereto and any electronic component may be used as long as a plurality of electronic elements are mounted together therein.

As set forth above, according to embodiments of the invention, in the power semiconductor module, the first electronic element disposed to be closest to the common connection terminal can dissipate heat through a large area (or volume) of the heat dissipation substrate relative to the other electronic elements. Thus, an optimum heat dissipation effect, while maintaining the size of the power semiconductor module, can be obtained.

In addition, since the junction temperature of the first electronic element is reduced, a generation of a problem in a particular electronic element due to imbalance of a temperature distribution can be minimized, and thus, long-term reliability and performance of the module can be enhanced.

While the present invention has been shown and described in connection with the embodiments, it will be apparent to those skilled in the art that modifications and variations can be made without departing from the spirit and scope of the invention as defined by the appended claims.

What is claimed is:

1. A power semiconductor module comprising:
   a common connection terminal that is a collector terminal;
   external connection terminals, including a gate connection terminal and an emitter connection terminal;
   a heat dissipation substrate electrically connected to the common connection terminal; and
   a plurality of electronic elements disposed on the heat dissipation substrate, the electronic elements having varying spaces therebetween and being disposed such that spaces therebetween are increased in width in a direction closer to the common connection terminal.

2. The power semiconductor module of claim 1, further comprising:
a base substrate;
at least one circuit board disposed on the base substrate,
wherein the heat dissipation substrate is disposed on the circuit board and the electronic elements are electrically connected to the common connection terminal through the heat dissipation substrate and the circuit board.

3. The power semiconductor module of claim 2, wherein the circuit board comprises a first circuit board to which the gate connection terminal is attached, a second circuit board to which the emitter connection terminal is attached, and a third circuit board to which the common connection terminal is attached.

4. The power semiconductor module of claim 3, wherein the electronic elements are electrically connected to the first and third circuit boards through bonding wires.

5. The power semiconductor module of claim 2, further comprising: a support substrate disposed below the base substrate and dissipating heat transmitted from the base substrate outwardly.

6. A power semiconductor module comprising:
a heat dissipation substrate electrically connected to a common connection terminal; and
a plurality of electronic elements disposed on the heat dissipation substrate, the plurality of electronic elements having varying spaces therebetween,
wherein the electronic elements are classified as first, second, third, and fourth electronic elements according to an order in which the electronic elements are disposed to be adjacent to the common connection terminal, and intervals $X_1$, $X_2$, and $X_3$ between the electronic elements satisfy Equation 1 shown below:

$$0.8d > X_1 + X_2 + X_3 > 0.4d \quad \text{[Equation 1]}$$

wherein d is an overall length of the heat dissipation substrate 50, $X_1$ is a space between the first electronic element and the second electronic element, $X_2$ is a space between the second electronic element and the third electronic element, and $X_3$ is a space between the third electronic element and the fourth electronic element.

7. The power semiconductor module of claim 6, wherein $X_1$, $X_2$, and $X_3$ satisfy Equation 2 shown below:

$$X_1 > X_2 > X_3. \quad \text{[Equation 2]}$$

8. The power semiconductor module of claim 6, wherein $X_3$ and $X_2$ satisfy Equation 3 and Equation 4 shown below:

$$X_3 = (1.5 \sim 3)X_2 = (1.5 \sim 15)X_1 \quad \text{[Equation 3]}$$

$$X_2 = (1.0 \sim 5)X_1. \quad \text{[Equation 4]}$$

9. A power semiconductor module comprising:
a heat dissipation substrate electrically connected to a common connection terminal; and
a plurality of electronic elements disposed on the heat dissipation substrate, the plurality of electronic elements having varying spaces therebetween,
the heat dissipation substrate having different thicknesses according to positions of the electronic elements.

10. The power semiconductor module of claim 9, wherein the heat dissipation substrate has reduced thicknesses in a direction away from the common connection terminal.

11. The power semiconductor module of claim 10, wherein the heat dissipation substrate has steps formed according to positions of the electronic elements.

12. The power semiconductor module of claim 11, wherein the electronic elements are classified as first, second, third, and fourth electronic elements according to an order in which the electronic elements are disposed to be adjacent to the common connection terminal, and intervals $X'_1$, $X'_2$, and $X'_3$ between the electronic elements satisfy Equation 5 through Equation 7 shown below:

$$H_4 = (X'_4/X'_3)H_3 \quad \text{[Equation 5]}$$

$$H_3 = (X'_3/X'_2)H_2 \quad \text{[Equation 6]}$$

$$H_2 = (X'_2/X'_1)H_1 \quad \text{[Equation 7]}$$

wherein $H_4$ is a height of the heat dissipation substrate at which the first electronic element is disposed, $H_3$ is a height of the heat dissipation substrate at which the second electronic element is disposed, $H_2$ is a height of the heat dissipation substrate at which the third electronic element is disposed, $H_1$ is a height of the heat dissipation substrate at which the fourth electronic element is disposed, $X'_4$ is a distance of the mounting surface of the heat dissipation substrate at which the first electronic device is disposed, $X'_3$ is a distance of the mounting surface of the heat dissipation substrate at which the second electronic device is disposed, $X'_2$ is a distance of a mounting surface of the heat dissipation substrate at which the third electronic element is disposed, and $X'_1$ is a distance of a mounting surface of the heat dissipation substrate at which the fourth electronic element is disposed.

13. A power semiconductor module comprising:
a common connection terminal that is a collector terminal;
a plurality of external connection terminals, including a gate terminal and an emitter terminal; and
a plurality of power semiconductor packages disposed in a row from the common connection terminal and electrically connected to the common connection terminal, the power semiconductor packages being disposed such that spaces therebetween are reduced in a direction away from the common connection terminal.

* * * * *